(12) United States Patent
Miyoshi et al.

(10) Patent No.: US 7,561,762 B2
(45) Date of Patent: Jul. 14, 2009

(54) SEMICONDUCTOR DEVICE HAVING OPTICAL SIGNAL INPUT-OUTPUT MECHANISM

(75) Inventors: Kazunori Miyoshi, Tokyo (JP); Kazuhiko Kurata, Tokyo (JP); Takanori Shimizu, Tokyo (JP); Ichiro Hatakeyama, Tokyo (JP); Junichi Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/575,482

(22) PCT Filed: Sep. 20, 2005

(86) PCT No.: PCT/JP2005/017268

§ 371 (c)(1),
(2), (4) Date: Mar. 16, 2007

(87) PCT Pub. No.: WO2006/035633

PCT Pub. Date: Apr. 6, 2006

(65) Prior Publication Data

US 2008/0036021 A1       Feb. 14, 2008

(30) Foreign Application Priority Data

Sep. 27, 2004   (JP) ............................. 2004-279897

(51) Int. Cl.
*G02B 6/12* (2006.01)
*G02B 6/26* (2006.01)
*G02B 6/42* (2006.01)

(52) U.S. Cl. ............................. 385/14; 385/31; 385/39; 385/47; 385/49

(58) Field of Classification Search ............... 385/14
See application file for complete search history.

(56) References Cited

U.S. PATENT DOCUMENTS

| 5,625,734 | A | * | 4/1997 | Thomas et al. ............... 385/88 |
| 6,718,764 | B1 |  | 4/2004 | Sarkar et al. |
| 6,912,333 | B2 | * | 6/2005 | Mikawa et al. ............... 385/14 |
| 7,046,871 | B2 | * | 5/2006 | Shen ........................... 385/14 |
| 7,333,682 | B2 | * | 2/2008 | Kobayashi et al. ............ 385/14 |
| 7,373,033 | B2 | * | 5/2008 | Lu et al. ...................... 385/14 |

(Continued)

FOREIGN PATENT DOCUMENTS

JP        60-059309 A      4/1985

(Continued)

*Primary Examiner*—Frank G Font
*Assistant Examiner*—Ryan Lepisto
(74) *Attorney, Agent, or Firm*—Sughrue Mion, PLLC

(57) ABSTRACT

A semiconductor device has printed wiring board (11) where electric wiring (18) connected to LSI chip (17) and to planar optical element (21) is formed, and where optical waveguide (25) which transfers light inputted into planar optical element (21) and/or light outputted from planar optical element (21) is fixed. Planar optical element (21) is mounted in one end of small substrate (13), and another end of small substrate (13) is connected to printed wiring board (11) by solder bump (26). One end of small substrate (13) where planar optical element (21) is mounted is fixed to printed wiring board (11) by a fixing mechanism. Small substrate (13) has flexible section (15), which is easily deformable compared with other portions of printed wiring board (11) and small substrate (13), in at least a partial region between one end where planar optical element (21) is mounted and another end electrically connected to printed wiring board (11).

7 Claims, 6 Drawing Sheets

U.S. PATENT DOCUMENTS

| | | |
|---|---|---|
| 2002/0001117 A1 | 1/2002 | Masghati et al. |
| 2003/0179979 A1* | 9/2003 | Ouchi ........................ 385/14 |
| 2004/0033008 A1* | 2/2004 | Mikawa et al. ................ 385/14 |
| 2004/0218848 A1* | 11/2004 | Shen et al. .................... 385/14 |
| 2005/0100264 A1* | 5/2005 | Kim et al. ..................... 385/14 |
| 2005/0180679 A1* | 8/2005 | Shimizu et al. ............... 385/14 |
| 2007/0183719 A1* | 8/2007 | Lee et al. ..................... 385/47 |
| 2008/0075405 A1* | 3/2008 | Wang et al. ................... 385/14 |

FOREIGN PATENT DOCUMENTS

| | | |
|---|---|---|
| JP | 61-279190 A | 12/1986 |
| JP | 02-025810 A | 1/1990 |
| JP | 4-120909 A | 10/1992 |
| JP | 5-501313 A | 3/1993 |
| JP | 2000-332301 A | 11/2000 |
| JP | 2001-185752 A | 7/2001 |
| JP | 2002-006161 A | 1/2002 |
| JP | 2002-353508 A | 12/2002 |
| JP | 2003-222746 A | 8/2003 |
| JP | 2003-322741 A | 11/2003 |
| WO | WO 91/06022 A1 | 5/1991 |

* cited by examiner

## SEMICONDUCTOR DEVICE HAVING OPTICAL SIGNAL INPUT-OUTPUT MECHANISM

TECHNICAL FIELD

The present invention relates to a semiconductor device having an optical signal input-output mechanism including an optical transmission medium, and an optical element, in particular, a planar optical element which transmits and receives an optical signal to and from the optical transmission medium and performs mutual transformation between the optical signal and an electric signal.

BACKGROUND ART

Recently, in semiconductor devices, for optical communication or optical interconnection in which semiconductor chips are interconnected by an optical signal route, optical modules which each perform mutual transformation between an optical signal and an electric signal have been used frequently. In the latest optical modules, planar optical elements are used as components in many cases, and their optical coupling systems need positioning accuracy of equal to or less than several tens of micrometers. What has been developed as a semiconductor device using such an optical module is a device that has an optical signal input-output unit having such structure in which, when an optical module is mounted in a predetermined position of an optical printed circuit board or is mounted in a predetermined position of a photoelectric composite substrate which is equipped with an optical waveguide as an optical transmission medium, optical coupling between a planar optical element of the optical module and the optical waveguide is made. In regard to such an optical signal input-output mechanism, practical application is expected particularly in the optical interconnection field.

As one of conventional examples, there is a semiconductor device disclosed in Japanese Patent Laid-Open No. 2000-332301. FIG. 1 is a schematic partially sectional view of the semiconductor device of this conventional example. This semiconductor device has the structure of a chip-size package in which LSI chip 57, which makes up a semiconductor integrated circuit, and planar optical element array 61a in which planar optical elements are arranged two-dimensionally, are packaged in outside dimensions comparable to LSI chip 57. Printed wiring board 51 and mold resin 68 are used for the packaging. Printed wiring board 51 is equipped with optical waveguide 65 in addition to electric wiring 58. As for optical waveguide 65, each optical input-output section is arranged on a top face of optical waveguide 65 which faces planar optical element array 61a. For that purpose, a reflecting surface which is formed in one end of optical waveguide 65 so as to form an angle of 45° to input/output light of planar optical element array 61a is used. LSI chip 57 is implemented in a predetermined position on printed wiring board 51, and planar optical element array 61a is implemented in a predetermined position on LSI chip 57, through solder bumps 66, respectively. Thereby, each optical input-output surface section of planar optical element array 61a is optically coupled with each optical input-output section of optical waveguide 65 with their optical axes being mutually aligned. Micro-lens 62 is provided at each input-output surface section of planar optical element array 61a, and at each optical input-output section of optical waveguide 65.

As another example, there is a semiconductor device disclosed in Japanese Patent Laid-Open No.2001-185752. FIG. 2 is a schematic partially sectional view of the semiconductor device in this conventional example. In this semiconductor device, TBGA (Tape Ball Grid Arrays) package structure 79 which embeds LSI chip 77 and planar optical element array 81a is implemented on printed wiring board 71 through electric wiring layer 78 and solder balls 86. Each input-output surface section of planar optical element array 81a is optically coupled with an optical input-output section of optical waveguide 85 with their optical axes being mutually aligned by TBGA package structure 79 which is implemented in a predetermined position on printed wiring board 71 in which optical waveguide 85 is formed. Micro-lens 82 is provided at each input-output surface section of planar optical element array 81a, and at each optical input-output section of optical wave guide 65.

Nevertheless, in the structure illustrated in the above-described conventional examples, it is difficult to keep planar optical element arrays 61a and 81a and optical waveguides 65 and 85 in a state in which their optical axes are aligned against a temperature change because of the difference between the coefficients of thermal expansion of printed wiring boards 51 and 71 and LSI chips 57 and 77 on which planar optical element arrays 61a and 81a are mounted, or the like. In addition, when a plurality of planar optical element arrays 61a and 81a are provided, it is difficult to simultaneously perform optical axis adjustment of them, and in order to achieve it, an extremely highly precise mounting technique will be required, and it will lead to a cost increase.

DISCLOSURE OF THE INVENTION

An object of the present invention is to provide a semiconductor device which has an optical signal input-output mechanism, and which can achieve highly precise optical axis alignment of a planar optical element with an optical transmission medium in a simplified structure which results in a low cost.

The semiconductor device of the present invention has a main substrate where electric wiring connected to a semiconductor element and connected to a planar optical element is formed. Furthermore, an optical transmission medium which transfers light inputted into the planar optical element and/or light outputted from the planar optical element is fixed to the main substrate.

The planar optical element is mounted on one end of a small substrate. In a first aspect of the present invention, another end of the small substrate is connected electrically to the main substrate and is fixed to the main substrate. In a second aspect, another end of the small substrate is connected electrically to a child substrate and is fixed to the child substrate. This child substrate is connected electrically to the main substrate and is fixed to the main substrate.

In either of these two aspects, one end of the small substrate where the planar optical element is mounted is fixed to the main substrate by a fixing mechanism so that an input-output surface of the planar optical element faces an optical input-output section of the optical transmission medium. The small substrate has a flexible section which is easily deformable in comparison with other portions of the main substrate and small substrate in at least a partial region between the one end where the planar optical element is mounted and the other end electrically connected to the main substrate or the child substrate.

In this way, although it is possible to make the semiconductor device of the present invention have a simplified structure, nevertheless, according to the present invention, it is possible to easily align the planar optical element accurately to the optical transmission medium. This is because it is possible to easily adjust a position of an end side of the small substrate, where the planar optical element is mounted, to the main substrate using deformation of the flexible section even when there is some tolerance in the mounting position of an end portion of the small substrate which is fixed to the main substrate or to the child substrate, and hence, it is possible to adjust the position of the planar optical element to the optical transmission medium thereby. Furthermore, the present invention does not need a technique for implementing the planar optical element and a member, on which the planar optical element is mounted, with high precision on the main substrate for optical axes alignment of the planar optical element with the optical transmission medium, and hence, it is possible to achieve cost reduction of the semiconductor device.

According to the present invention, it is also possible to suppress occurrence of a misalignment between the optical axes of the planar optical element and the optical transmission medium resulting from deviation of the planar optical device relative to the main substrate because of an environmental change such as a temperature change. This is because, even when the difference of thermal expansion or thermal shrinkage is generated because of temperature changes of the small substrate, of the main substrate, and/or of the child substrate, it is absorbed by deformation of the flexible section.

In the present invention, the flexible section can have a bend which curves convexly toward a direction away from the main substrate, and/or constriction structure in which a width becomes narrow in a direction orthogonal to a line connecting one end, where the planar optical element is mounted, and connecting another end electrically connected to the main substrate, and/or can have a slit extending toward this line. These structures make it possible to easily deform the flexible section so as to enable a positional adjustment of the one end where the planar optical element is mounted.

The small substrate may be an elastically deformable thin substrate, and in particular, may be a plastic film.

The planar optical element may have a plurality of input-output surfaces, and the optical transmission medium may have a plurality of optical input-output sections which correspond to the plurality of input-output surfaces, respectively.

The semiconductor device of the present invention may have a plurality of small substrates where the planar optical elements are mounted, respectively.

BEST MODE FOR CARRYING OUT THE INVENTION

Figure 1:
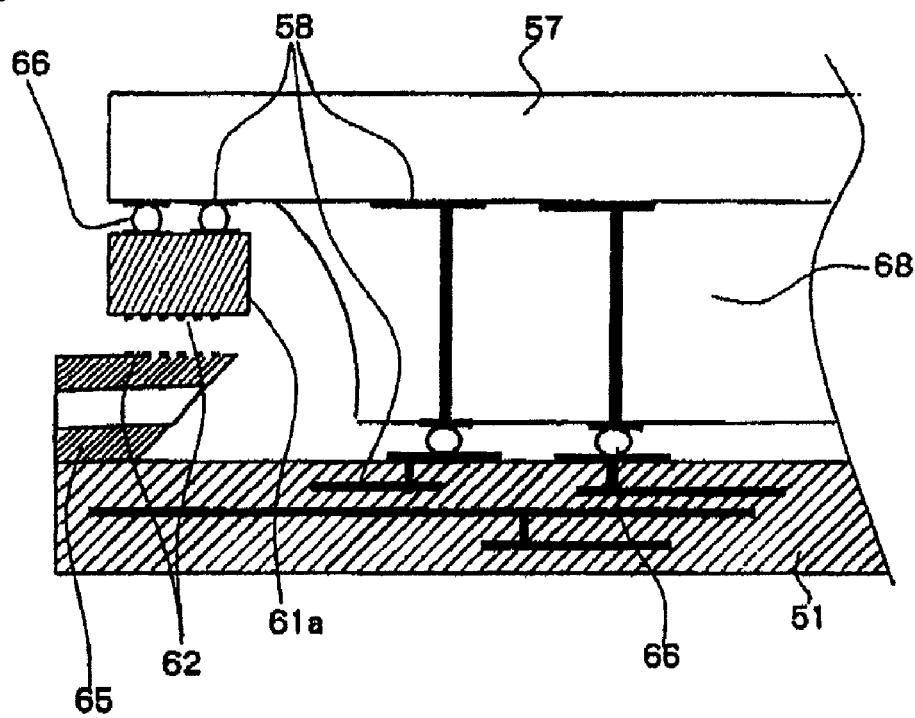
FIG. 1 is a schematic partially sectional view of a semiconductor device of a conventional example which has an optical input-output mechanism.
Figure 2:
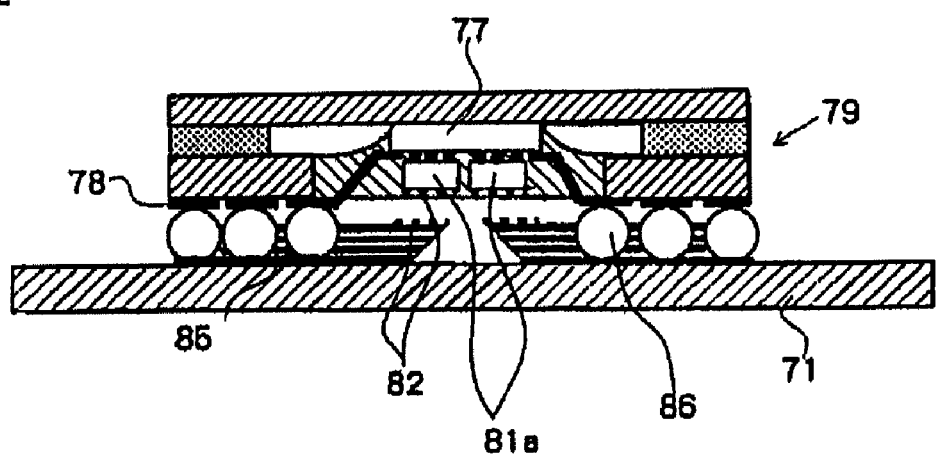
FIG. 2 is a schematic partially sectional view of a semiconductor device of another conventional example which has an optical input-output mechanism.
Figure 3A:
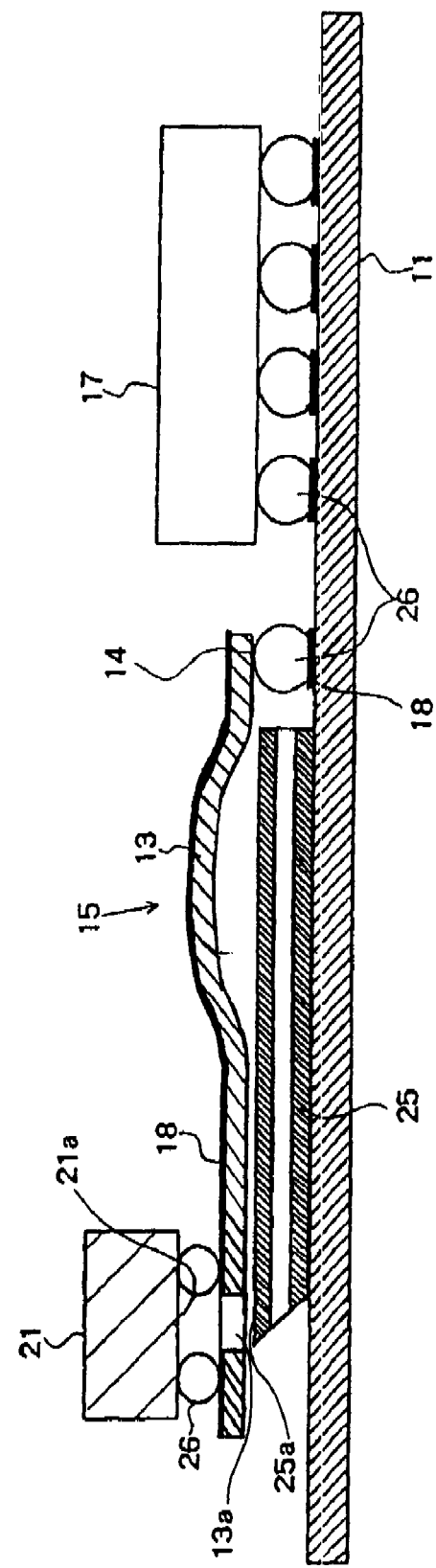
FIG. 3A is a schematic sectional view of a semiconductor device of a first embodiment of the present invention which has an optical input-output mechanism.
Figure 3B:
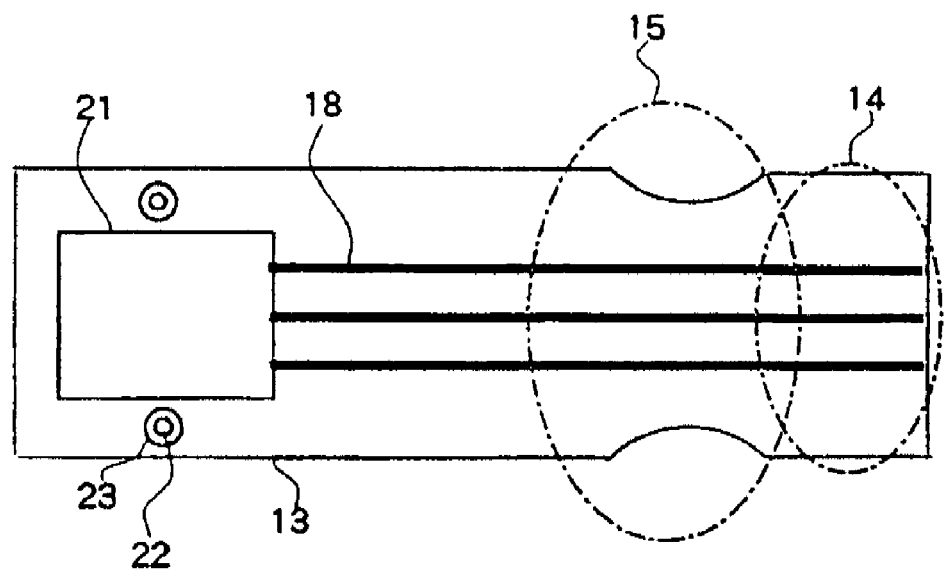
FIG. 3B is a schematic top view of a small substrate in the semiconductor device in FIG. 3A.
Figure 3C:
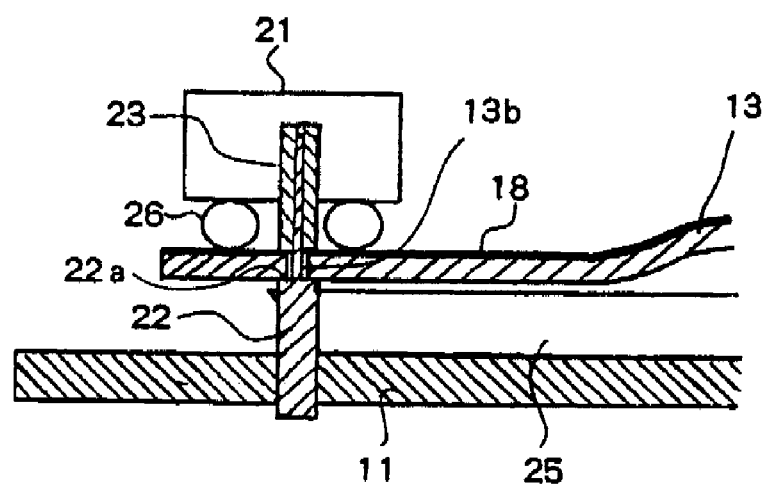
FIG. 3C is a sectional view of a portion of a fixing mechanism of an end portion of the small substrate, where the planar optical element is provided, in the semiconductor device in FIG. 3A.

FIGS. 3A to 3C illustrate a semiconductor device of a first embodiment of the present invention. This semiconductor device has printed wiring board 11 as a main substrate where electric wiring 18 with a desired pattern is formed and where optical waveguide 25 as an optical transmission medium is also formed. Optical waveguide 25 has optical input-output section 25$a$ located on a top face of its one end in FIG. 3A.

On printed wiring board 11, LSI chip 17 is implemented through solder bump 26, and, planar optical element 21, which may be a planar light-receiving element or a planar light-emitting element which performs transformation between an optical signal and an electric signal, is connected through small substrate 13. That is, planar optical element 21 is fixed to one end on small substrate 13, where the electric wiring 18 is formed, with solder bump 26, and another end of small substrate 13 forms substrate connecting portion 14 connected to printed wiring board 11 through solder bump 26. A material other than solder and/or a connection member having a form other than a bump, such as a conductive pin may be used for connection between the small substrate 13 and printed wiring board 11.

In the semiconductor device of this embodiment, optical waveguide 25, planar optical element 21, and small substrate 13 construct an optical input-output mechanism which enables transfer of an optical signal to and from LSI chip 17.

Planar optical element 21 has input-output surface section 21$a$ in a side which faces small substrate 13. Light passing aperture 13$a$ is formed in a position, that corresponds to input-output surface section 21$a$, of small substrate 13.

Small substrate 13 may be a thin substrate which is elastically deformable and mechanically flexible, and in which at least an area in fixed length in a direction along a line that connects substrate connecting portion 14 and a portion in which planar optical element 21 is implemented, forms flexible section 15 which is easily deflectable. In the example illustrated in FIGS. 3A and 3B, flexible section 15 is arranged near substrate-connecting portion 14 of small substrate 13.

In flexible section 15, a bend that is convex upward, that is, in a direction away from the printed wiring board 11 is provided, as illustrated in FIG. 3A. Furthermore, as shown in FIG. 3B flexible section 15 has the constriction structure in which both side sections are notched in hemicycles to have a narrowed width, and which is a kind of elastic structure. Flexible section 15 can be easily displaced in a vertical direction (that is, a warp direction) and a horizontal direction (that is, a twisted direction) because of the synergistic effect of the upward bend and constriction structure.

Owing to this flexible section 15, it becomes possible to move planar optical element 21 within a small range even after fixing substrate-connecting portion 14. Taking advantage of this possibility, planar optical element 21 is fixed to printed wiring board 11 with input-output surface section 21$a$ being positioned such that its optical axis coincides with that of optical input-output section 25a of optical waveguide 25 formed on printed wiring board 11.

A fixing mechanism of an end portion of small substrate 13, where planar optical element 21 is mounted, to printed wiring board 11, does not have any particular limitation. In this embodiment, as shown in FIG. 3(c), fixing is performed by passing guide pin 22, installed in printed wiring board 11, through guide hole 13b formed in small substrate 13, and by fixing cap-like fixing part 23 to guide pin 22. Guide pin 22 has step portion 22a through which a diameter in an upper side of guide pin 22 is narrowed. The diameter of guide hole 13b is smaller than a larger diameter portion at a lower side of guide pin 22, and small substrate 13 is supported with the lower face being placed on step portion 22a. At this time, since the diameter of guide hole 13b is larger than a smaller diameter portion at an upper side of guide pin 22, it is possible to finely adjust a position of planar optical element 21 by sliding small substrate 13 on step portion of guide pin 22. Taking advantage of this possibility, optical axes of input-output surface portion 21a of planar optical element 21, and optical input-output portion 25a of optical waveguide 25 are aligned, and then fixing part 23 is pressed into guide pin 22. A position of the end portion of small substrate 13 where planar optical element 21 is implemented, and therefore, a position of planar optical element 21, are fixed relative to printed wiring board 11 by sandwiching small substrate 13 between the lower face of fixing part 23 and the top face of step portion 22a of guide pin 22, in this way.

According to this embodiment, without needing to greatly increase the mounting accuracy of small substrate 13 at substrate-connecting portion 14, it is possible to arrange planar optical element 21 with its optical axis being aligned to that of optical waveguide 25. Furthermore, in the structure of this embodiment, even when a temperature change occurs in small substrate 13 and printed wiring board 11, it is possible to absorb distortion, caused by the difference between the amount of thermal expansion, the amounts of thermal shrinkage, or the like of both, by deformation of flexible section 15 of small substrate 13. Thereby, when the temperature changes, it is possible to prevent a force, which causes a position shift of planar optical element 21 relative to printed wiring board 11, from being applied to planar optical element 21, and to prevent a discrepancy arising between optical axes of planar optical element 21 and optical waveguide 25.

Figure 4A:
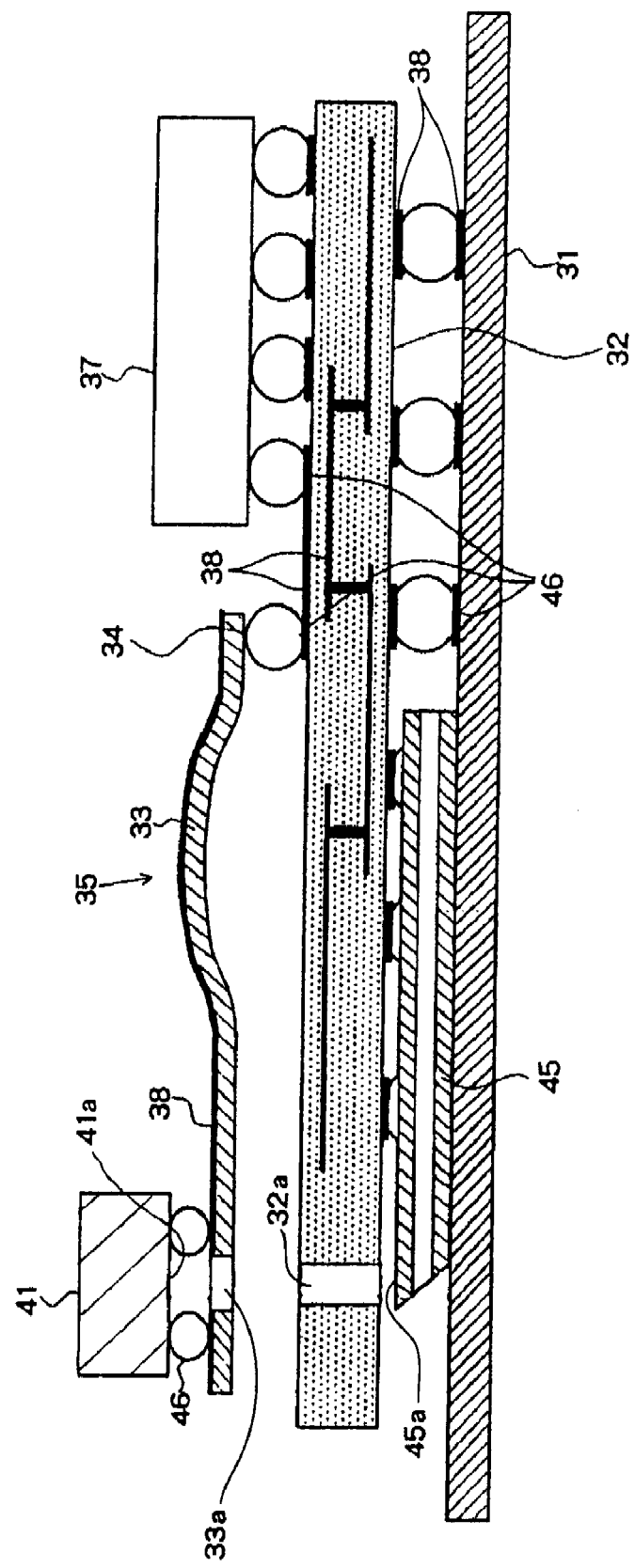
FIG. 4A is a schematic sectional view of a semiconductor device of a second embodiment of the present invention which has an optical input-output mechanism.
Figure 4B:
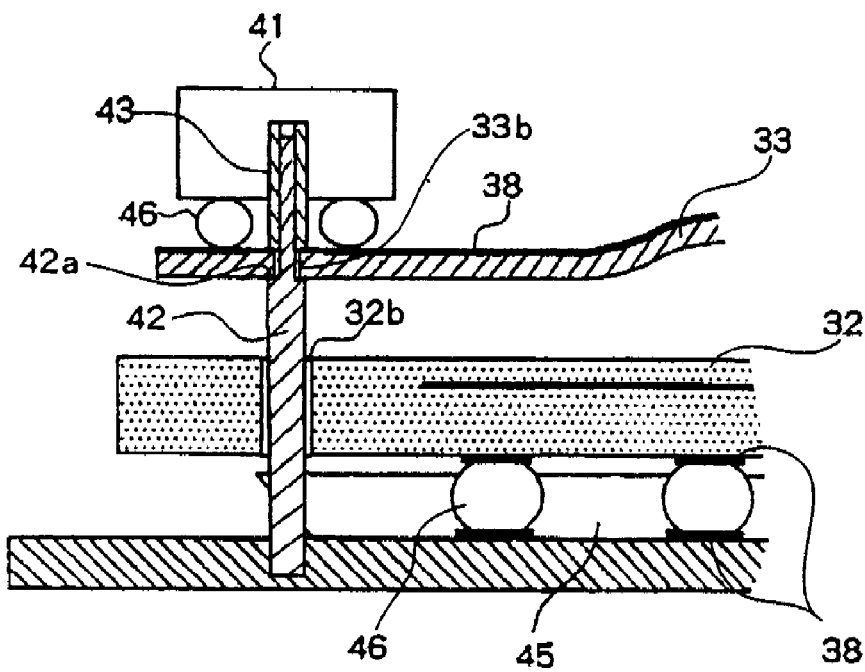
FIG. 4B is a sectional view of a portion of a fixing mechanism of an end portion of the small substrate, where the planar optical element is provided, in the semiconductor device in FIG. 4A.

Next, FIGS. 4A and 4B illustrate a semiconductor device of a second embodiment of the present invention. Planar optical element 41 is connected by bumps 46 to one end on small substrate 33 on which electric wiring 38 is formed. In this embodiment, planar optical element 41 and small substrate 33 construct an optical input-output mechanism for LSI chip 37, implemented on child substrate 32.

Light passing aperture 33a is formed in a portion of small substrate 33 corresponding to optical input-output surface section 21a of planar optical element 21. Here, small substrate 33 may be a thin substrate which is elastically deformable and mechanically flexible. Another end of small substrate 33 is connected to child substrate 32, on both sides of which electric wiring is provided, in substrate connecting portion 34 by solder bump 46. Furthermore, child substrate 32 is connected to printed wiring board 31 by solder bumps 46. In child substrate 32, light passing aperture 32a is formed in a position that corresponds to optical input-output surface section 45a of optical waveguide 45 provided on printed wiring board 31. Here, a material other than solder and/or a connection member having a form other than a bump, such as a conductive pin, may be used for making a connection between small substrate 33 and child substrate 32, and for making a connection between child substrate 32 and printed wiring board 31.

Flexible section 35 is provided near substrate-connecting portion 34 of small substrate 33. Since flexible section 35 has the same structure and the same function as flexible section 15 in the first embodiment described with reference to FIGS. 3A to 3C, detailed description will be omitted.

Owing to flexible section 35, it becomes possible to move planar optical element 41 within a small range even in a state in which substrate-connecting portion 34 is fixed. Thereby, it is possible to align planar optical element 41 with optical waveguide 45 formed on printed wiring board 31.

Small substrate 33 is fixed to printed wiring board 31 by guide pin 42, which is fixed to printed wiring board 31, and by fixing part 43 after optical axes are aligned. In relation to this, hole 32b for passing guide pin 42 is formed in child substrate 32, and its inner diameter is somewhat larger than the diameter of guide pin 42. The dimensions of guide hole 33b which is provided in small substrate 33 and through which guide pin 42 passes are smaller than those of the larger diameter portion at the lower part of guide pin 42, and larger than those of the smaller diameter portion at the upper part. Hence, it is possible to finely adjust a position of planar optical element 41 by sliding small substrate 33 on step portion 42a of guide pin 42. In this way, it is possible to fix planar optical element 41 with its optical axis being aligned with that of optical waveguide 45 on printed wiring board 31.

According to this embodiment, even when there is some tolerance in the mounting position of small substrate 33 at substrate-connecting portion 34, it is possible to easily adjust and to fix planar optical element 41 in an accurate position relative to optical input-output section of optical waveguide 25. Furthermore, in the structure of this embodiment, even when a temperature change occurs in small substrate 33, printed wiring board 31, and child substrate 32, it is possible to absorb distortion, caused by the difference between the amount of thermal expansion or the amount of thermal shrinkage of these members, by deformation of flexible section 35 of small substrate 33. Thereby, when a temperature changes, it is possible to prevent a force, which causes a position shift of planar optical element 41 relative to printed wiring board 31, from being applied to planar optical element 41. In addition, at this time, it is also thought that child substrate 32 is displaced relative to printed wiring board 31, and therefore, is displaced relative to guide pin 42 fixed to printed wiring board 31. However, since a gap is formed between hole 32b and guide pin 42, it is possible to prevent a force that is caused by this displacement from being applied to guide pin 42 and to prevent guide pin 42 from being displaced, and hence, it is possible to prevent the displacement of guide pin 42 that causes displacement of the portion of small substrate 33 in which planar optical element 41 is provided. Thereby, it is possible to prevent a discrepancy arising between the optical axes of planar optical element 41 and optical waveguide 45.

Figure 5:
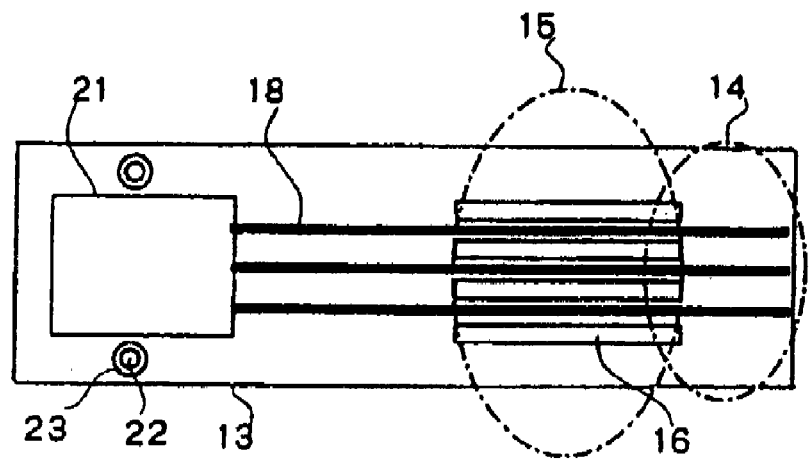
FIG. 5 is a schematic top view of a small substrate in the semiconductor device of a third embodiment of the present invention.

FIG. 5 is a schematic top view of a small substrate in a third embodiment of the present invention. Since the general structure of the semiconductor device of this embodiment may be the same as the above-described first embodiment or second embodiment, detailed description will be omitted. In the description of this embodiment, the same reference numerals as those in the first embodiment are used.

In this embodiment, flexible section 15 is provided in a portion near substrate-connecting portion 14 of small substrate 13 similar to the first and second embodiments, and this flexible section 15 has an upward bend, but this is not shown.

On the other hand, flexible section 15 of this embodiment does not have the constriction structure which is provided in the first and second embodiments, but, instead, a plurality of slits 16 extending in a longitudinal direction of small substrate 13 are provided. Owing to slits 16, the stiffness of this flexible section 15 is reduced. Flexible section 15 can be easily deformed in a vertical direction (that is, a warp direction) and a horizontal direction (that is, a twist direction) because of the synergistic effect of slits 16 and the bend.

In each embodiment described above, planar optical elements 21 and 41 may be the planar optical element arrays where a plurality of input-output surface sections 21a and 41a are arrayed two-dimensionally. In this case, optical waveguides 25 and 45 may also have a plurality of optical input-output sections 25a and 45a, which is arrayed two-dimensionally, in accordance with a plurality of input-output surface sections 21a and 41a of planar optical elements 21 and 41. Micro-lenses may be provided in each of input-output surface sections 21a and 41a of planar optical elements 21 and 41 and in each of optical input-output sections 25a and 45a of optical waveguides 25 and 45. Small substrates 13 and 33 may be made from a resin, such as polyimide, or may be made from another resin which has elasticity, and may have plasticity. Optical waveguides 25 and 45 as optical transmission media may be constructed of optical fibers. In addition, in each embodiment, planar optical element 41, small substrate 33, child substrate 32, guide pin 42, fixing member 43, or the like may be plural, respectively.

In addition, as a modified example of each embodiment, flexible sections 15 and 35 may have a structure that has both the constriction structure in the first and second embodiments and slits in the third embodiment. Instead of guide pins 22 and 42, guide holes may be provided in printed wiring boards 11 and 31, and they may be used for optical axis alignment. In order to fix the end portions of small substrates 13 or 33, where planar optical element 21 or 41 is mounted, to printed wiring boards 31, a fixing mechanism that is separate from guide pins 22 or 42 for optical axis alignment, or the like may be used.

In addition, as a modified example of the second embodiment mentioned above, a structure, in which planar optical element 41, which is mounted on small substrate 33, is located on any one place of the four sides or the four corners of child substrate 32, may be employed.

Figure 6:
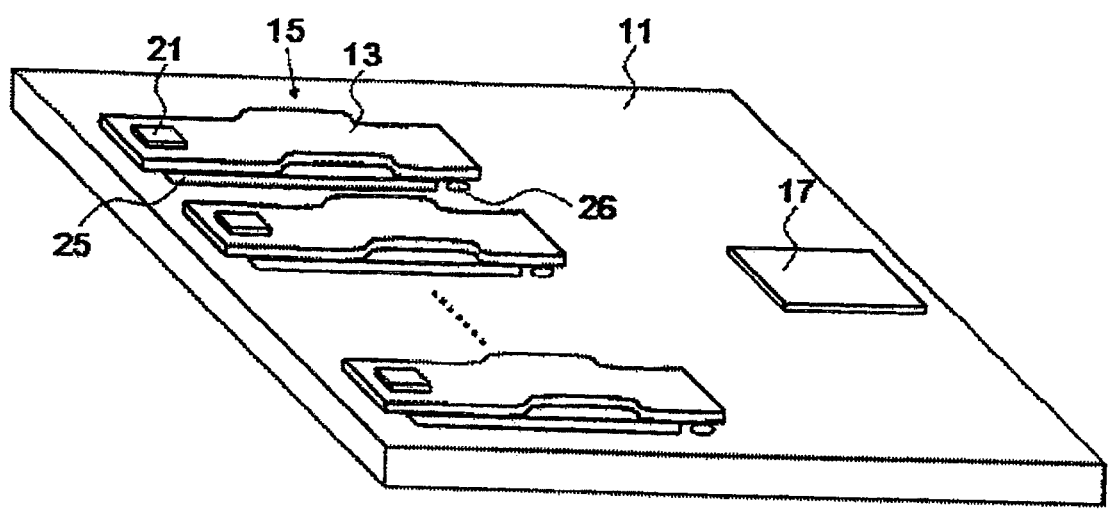
FIG. 6 is a view of an embodiment of the invention in which a plurality of small substrate are mounted on the main substrate.

In addition, as a modified example of the first embodiment described above, a plurality of small substrates 13 may be mounted to the printed wiring board 11, as shown in FIG. 6.

The invention claimed is:

1. A semiconductor device having:
a semiconductor element;
a planar optical element;
a main substrate where electric wiring connected to said semiconductor element and to said planar optical element is formed, and where an optical transmission medium which transfers light inputted into said planar optical element and/or light outputted from said planar optical element is fixed;
a small substrate on one end of which is mounted said planar optical element, and another end of which is electrically connected to said main substrate and is fixed to said main substrate; and
a fixing mechanism which fixes one end of said small substrate, where said planar optical element is mounted, to said main substrate so that an input-output surface of said planar optical element faces an optical input-output section of said optical transmission medium,
wherein said small substrate has a flexible section, which is easily deformable in comparison with other portions of said main substrate and said small substrate, the flexible section disposed at least at a partial region between the end where said planar optical element is mounted and the end electrically connected to said main substrate,
wherein at least a portion of the flexible section is bent in a direction away from printed wiring board to form a convex shape,
wherein the portion of the flexible section that forms the convex shape is not fixed to printed wiring board.

2. The semiconductor device according to claim 1, wherein said flexible section of said small substrate has a constriction structure in which a width is narrowed in a direction orthogonal to a line connecting one end, where said planar optical element is mounted, and connecting another end electrically connected to said main substrate.

3. The semiconductor device according to claim 1, wherein said flexible section of said small substrate has a slit which extends parallel to a line connecting one end, where said planar optical element is mounted, and connecting another end electrically connected to said main substrate.

4. The semiconductor device according to claim 1, wherein said small substrate is a thin substrate which is elastically deformable.

5. The semiconductor device according to claim 4, wherein said small substrate is a plastic film.

6. The semiconductor device according to claim 1, wherein said planar optical element has a plurality of said input-output surfaces, and said optical transmission medium has a plurality of said optical input-output sections which correspond to a plurality of said input-output surfaces, respectively.

7. The semiconductor device according to claim 1, wherein a plurality of said small substrates is mounted on said main substrate,
wherein a planar optical element is mounted on each of the plurality of small substrates.

* * * * *